United States Patent [19]

Beekmans et al.

[11] 4,439,692

[45] Mar. 27, 1984

[54] FEEDBACK-CONTROLLED SUBSTRATE BIAS GENERATOR

[75] Inventors: Jan J. P. M. Beekmans, San Jose, Calif.; John B. Hughes, Saltdean, Near Brighton, England

[73] Assignee: Signetics Corporation, Sunnyvale, Calif.

[21] Appl. No.: 327,972

[22] Filed: Dec. 7, 1981

[51] Int. Cl.[3] ........................ H03L 1/00; H03K 3/354

[52] U.S. Cl. .................................... 307/297; 307/304

[58] Field of Search ............... 307/296 R, 296 A, 297, 307/304

[56] References Cited

U.S. PATENT DOCUMENTS

| | | | |
|---|---|---|---|
| 3,806,741 | 4/1974 | Smith | 307/304 |
| 4,229,667 | 10/1980 | Heimbigner et al. | 307/297 |
| 4,322,675 | 3/1982 | Lee et al. | 307/297 X |
| 4,336,466 | 6/1982 | Sud et al. | 307/297 |
| 4,344,003 | 8/1982 | Harmon et al. | 307/296 A |
| 4,388,537 | 6/1983 | Kanuma | 307/297 |

OTHER PUBLICATIONS

Frantz, "Threshold Voltage Control for N-Channel MOSFET Devices", IBM Tech. Disl. Bull., vol. 12, No. 12, p. 2078, May 1970.

S. Chen et al., "Feedback Substrate Bias Generator", *IBM Technical Disclosure Bulletin*, vol. 23, No. 5, Oct. 1980, pp. 1930–1931.

*Primary Examiner*—Larry N. Anagnos
*Assistant Examiner*—David R. Bertelson
*Attorney, Agent, or Firm*—R. Meetin; R. Mayer; J. Oisher

[57] ABSTRACT

A semiconductor circuit supplies a substrate back bias voltage that is feedback controlled as a function of the sum of the positive threshold voltage of one field-effect transistor (FET) and the negative threshold voltage of a second FET. Preferably, one of the FET's is an enhancement-mode device, and the other is a like-polarity depletion-mode device. This arrangement enables the bias voltage to vary from chip to chip in such a manner as to speed up the logic gates on a chip containing the slowest gates and to slow down the logic gates on a chip containing the fastest logic gates, thereby decreasing the chip-to-chip spread in gate propagation delay and average power dissipation. The worst-case noise margin increases slightly.

17 Claims, 4 Drawing Figures

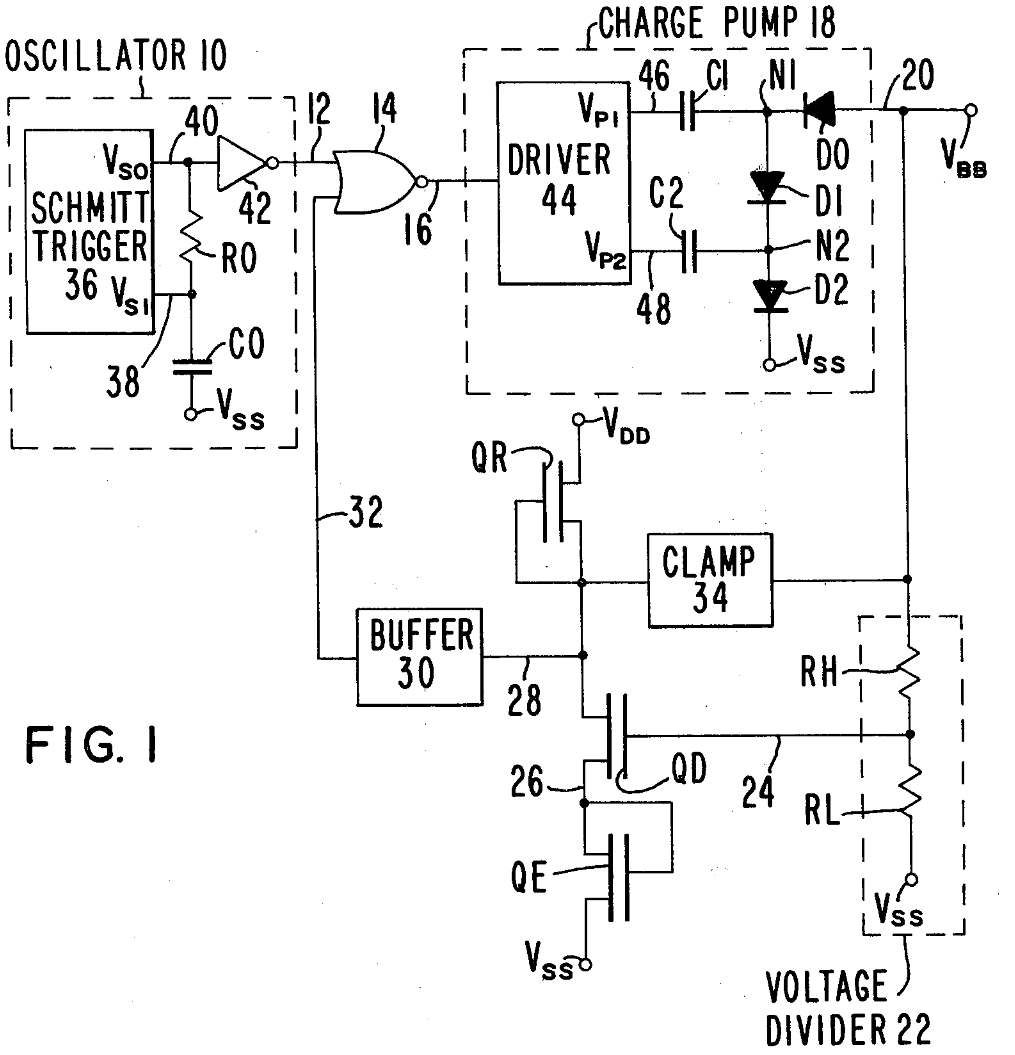
FIG. 1
FIG. 4
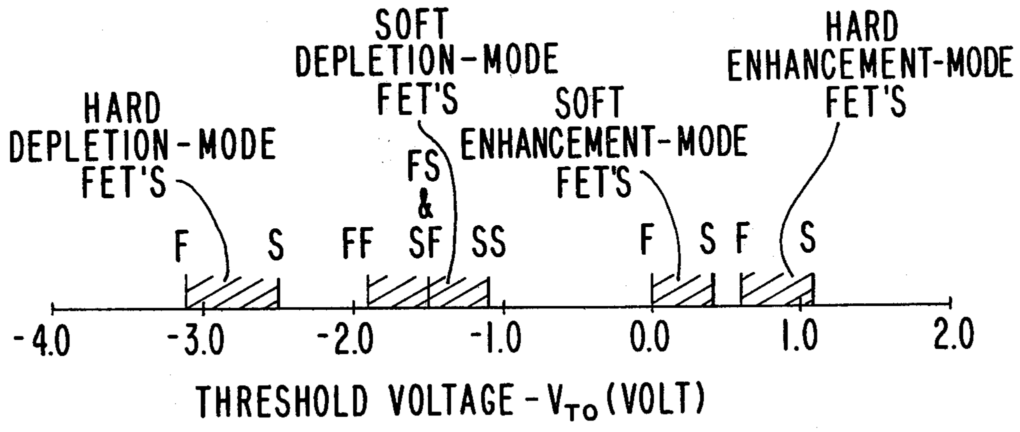

FEEDBACK-CONTROLLED SUBSTRATE BIAS GENERATOR

FIELD OF USE

This invention relates generally to semiconductor integrated circuits and more particularly to circuits for generating a bias voltage for a semiconductor substrate containing one or more field-effect transistors (FET's).

BACKGROUND ART

A conventional technique for improving the performance of an integrated circuit containing insulated-gate FET's formed on a substrate is to provide a back bias voltage to the substrate at a suitable voltage level different from ground reference. This voltage level is negative for N-channel FET's and positive for P-channel FET's. The substrate bias voltage is typically generated on-chip with a circuit containing a charge pump.

S. Chen et al disclose such an on-chip circuit in "Feedback Substrate Bias Generator", *IBM Technical Disclosure Bulletin,* Vol. 23, No. 5, October, 1980, pp 1930–1. In this N-channel circuit, a ring oscillator provides an oscillating voltage to one input terminal of a two-input NOR gate whose output signal drives a single-stage charge pump which produces the substrate bias voltage. This is fed back to a capacitive voltage divider whose output controls a depletion-mode FET in an inverter. The output of the inverter is then supplied to the other input terminal of the NOR gate to provide closed-loop regulation of the bias voltage. More particularly, the input sections of the NOR gate consist of a pair of enhancement-mode FET's, one of which has its gate electrode connected to the drain of the depletion-mode FET for receiving the inverter output signal. When the bias voltage is above the threshold voltage of the depletion-mode FET, the inverter provides a logical "0" to the NOR gate so as to allow its output to change state at the ring oscillator frequency. This activates the charge pump which draws charge from the substrate to bring the bias voltage down to approximately the threshold voltage of the depletion-mode FET.

Chen et al indicate that their substrate bias generator compensates for temperature variations and can stabilize the bias voltage against chip-to-chip process variations that occur during integrated circuit fabrication. However, so stabilizing the bias voltage does not simultaneously act to significantly alleviate worst-case values for average gate propagation delay, power dissipation, and noise margin of metal-oxide semiconductor (MOS) FET static logic gates on the chips.

More specifically, MOS integrated circuit fabrication processes are conventionally characterized in terms of the four chip-to-chip processing corners commonly referred to as Fast Fast (FF), Fast Slow (FS), Slow Fast (SF), and Slow Slow (SS). The first word (letter) of each pair of words (letters) refers to the extreme parameters of enhancement-mode FET's, and the second word (letter) refers to the extreme parameters of depletion-mode FET's. The range from Slow to Fast for one of the types of FET's thus refers to the spread in performance from chip-to-chip for that particular type of FET. FET's operate at the greatest speed in the Fast condition while the converse is true for the Slow condition.

Processing variations and variations in operating conditions such as drain supply voltage and chip temperature often produce wide differences in gate performance. Typically, the chip-to-chip spread in average gate propagation delay is 300–400 percent at the same temperature and drain supply voltage. The spread in average gate power dissipation is slightly less.

The difficulty in insuring that worst-case propagation delay, power dissipation, and noise margin do not go beyond prescribed specification limits is that these worst-case parameters do not all occur at the same corner of the processing range or at the same end of the operating conditions. The greatest propagation delay occurs at the SS corner at maximum temperature and maximum drain supply voltage. The greatest power dissipation occurs at the FF corner at minumum temperature and maximum supply voltage. Power dissipation is, however, most critical at high temperature. The noise margin is lowest at the FF corner at minimum supply voltage and maximum temperature.

Consideration has been given to a substrate bias generator in which the bias voltage is varied in such a manner as to stabilize the average gate propagation delay of a string of NOR gates that form an oscillator. This technique, however, does not provide a desirable noise margin profile across the FET processing range.

DISCLOSURE OF THE INVENTION

In accordance with the invention, a feedback-controlled bias voltage generator for a semiconductor substrate provides a back bias voltage that varies from chip-to-chip in such a manner as to significantly alleviate worst-case performance variations resulting from manufacturing variations. In the present bias generator, an oscillator repetitively supplies an oscillating signal at a given frequency. Gating circuitry (such as a NOR gate) responsive to the oscillating signal and a feedback signal supplies a gating signal which varies at the given frequency only when the feedback signal achieves a specified first relationship (such as a logical "0"). A charge pump responsive to the gating signal supplies the bias voltage on an output line and causes the bias voltage to move unidirectionally toward a desired value only when the gating signal achieves a specified second relationship (such as dropping from a logical "1" to a logical "0"). Feedback circuitry provides an internal voltage bearing a specified third relationship to the bias voltage (such as substantially a given fraction of the bias voltage). The feedback circuitry comprises a pair of FET's, one having a positive threshold voltage and the other having a negative threshold voltage, so arranged that the feedback signal achieves the first relationship when the absolute value of a reference voltage comprising the sum of the threshold voltages equals or exceeds the absolute value of the internal voltage.

A first of the FET's has one of its source/drain elements coupled to a supply of a substantially constant voltage while its gate electrode and its other source/-drain element are commonly coupled to one of the source/drain elements of the second of the FET's. At its gate electrode, the second FET receives the internal voltage on an internal line while its other source/drain element supplies the feedback signal on a feedback line. The absolute value of the threshold voltage of the second FET is chosen to exceed that of the first FET. Preferably, the first FET is an enhancement-mode device, and the second FET is a like-polarity depletion-mode device.

The absolute value of the reference voltage reaches a maximum in the FF corner of the FET processing range and a minumum in the SS corner. As a result, the absolute value of the difference between the constant voltage and the bias voltage when it reaches a steady-state value is a maximum in the FF corner and a minimum at the SS corner. This slows down the fastest FET's and speeds up the slowest FET's.

In particular, where the FET's are N-channel devices, the bias generator produces its highest bias voltage in the SS corner. This lowers all FET threshold voltages so as to increase source-to-drain current and thereby decrease the greatest gate propagation delay. The lowest average power dissipation increases but still remains relatively low so that chip temperature remains relatively low in the SS corner.

On the other hand, the bias voltage is lowest for chips processed in the FF corner where speed is normally highest. This raises the threshold voltages so as to increase the lowest propagation delay and thereby slow down the fastest logic gates. The lowest noise margin increases while the highest average power dissipation is reduced. The present bias generator typically leads to approximately a 25 percent reduction in the spread between the worst-case and best-case operating conditions for gate propagation delay and average power dissipation.

In a preferred arrangement, a voltage divider divides the bias voltage to generate the internal voltage as a given fraction of the bias voltage. Normally, the voltage divider comprises a pair of divider sections, each consisting of at least one resistively-connected FET. Alternatively, each divider section may consist of a resistor of polycrystalline semiconductor material.

A clamp is desirably employed to prevent the bias voltage from entering a restricted voltage range. For example, in the case of N-channel devices, the clamp typically prevents the bias boltage from rising above the constant voltage which is normally ground. Preferably, the clamp consists of a depletion mode FET having its gate electrode coupled to the output line, one of its source/drain elements coupled to the source of the constant voltage, and its other source/drain element coupled to the feedback line, so that its threshold voltage is the limiting value of the bias voltage.

BRIEF DESCRIPTION OF THE DRAWINGS

FIG. 1 is a diagram, partly in block form and partly in circuit form, of an embodiment of a substrate bias generator in accordance with the invention.

FIG. 4 is a graph illustrating the ranges in threshold voltage for several types of N-channel FET's.

Like reference symbols are employed in the drawings and in the description of the preferred embodiments to represent the same or very similar item or items.

DESCRIPTION OF THE PREFERRED EMBODIMENTS

Figure 2:
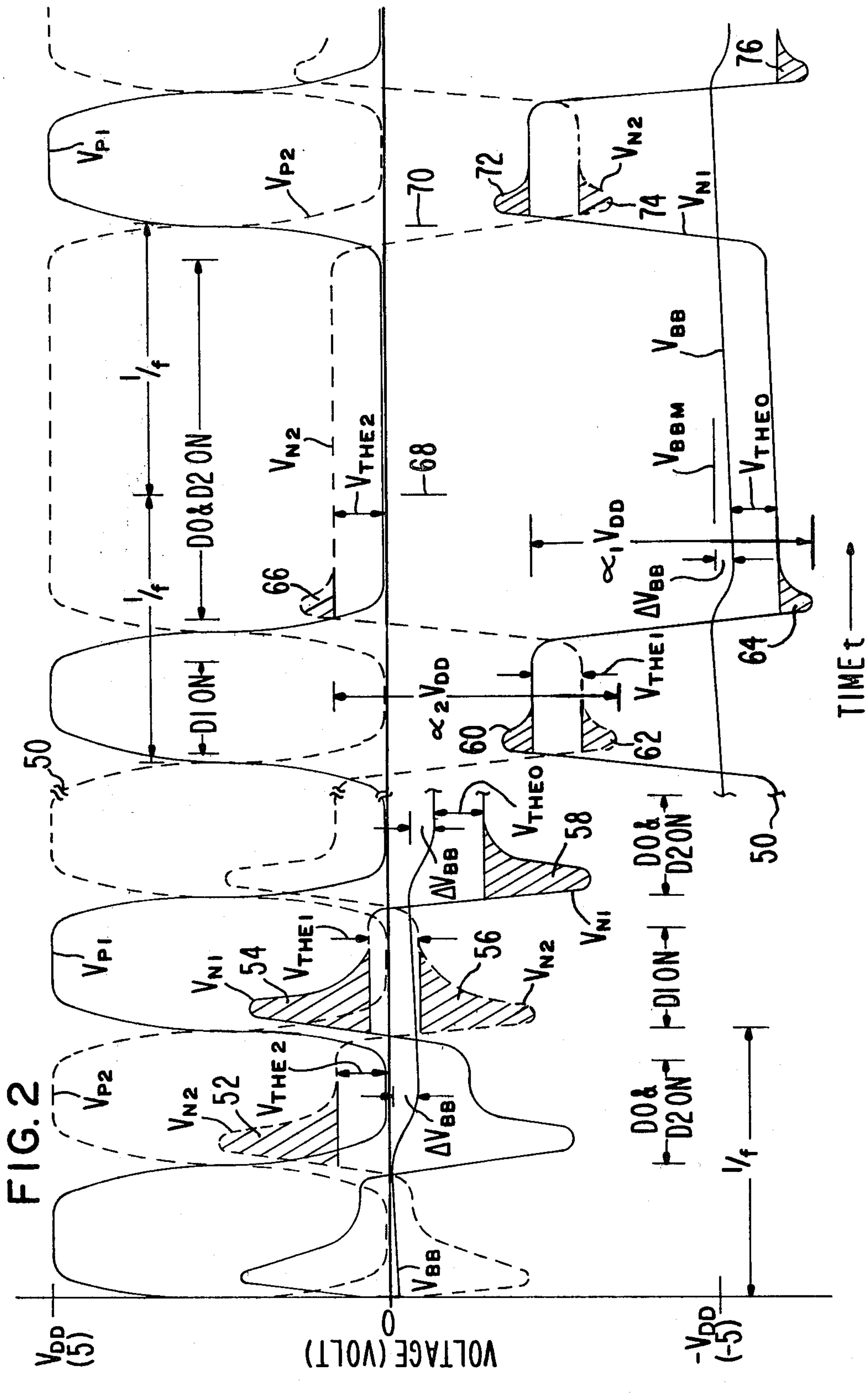
FIG. 2 is a graph illustrating various voltages associated with the substrate bias generator of FIG. 1 in producing the bias voltage.

Referring to the drawings, FIG. 1 illustrates a circuit for an on-chip bias voltage generator for a silicon semiconductor substrate. In this circuit, a free-running oscillator 10 repetitively provides a digital oscillating signal at a given frequency f on a line 12 to one input terminal of a two-input NOR gate 14. The digital output signal $V_N$ from NOR gate 14 is supplied on a line 16 to a charge pump 18 which supplies a back bias voltage $V_{BB}$ for the substrate on an output line 20.

Bias voltage $V_{BB}$ is controlled through a feedback loop in which a voltage divider 22 provides a fraction of voltage $V_{BB}$ as an internal signal $V_{INT}$ on an internal line 24 to the gate electrode of an N-channel depletion-mode FET QD whose source is connected to both the drain and gate electrode of an N-channel enhancement-mode FET QE. Its source is connected to a substantially constant voltage $V_{SS}$ which is preferably 0 volt (ground reference). FET's QE and QD each preferably have a gate width-to-length ratio of 4. The drain of FET QD is connected through a resistive impedance element which is nominally about 200 kiloohms to a voltage/current supply $V_{DD}$ which is nominally about 5 volts. The impedance element is an N-channel depletion-mode FET QR having its drain connected to drain supply $V_{DD}$ and its gate electrode and source commonly connected to the drain of FET QD. FET QR preferably has a gate width-to-length ratio of 1/16. A feedback signal $V_{FB}$ from the drain of FET QD is provided on a feedback line 28 to a buffer 30 and then, as amplified, from buffer 30 on a line 32 to the other input terminal of NOR gate 14. Preferably, a clamp 34 is connected between lines 20 and 28 to prevent bias voltage $V_{BB}$ from rising above $V_{SS}$.

Returning to oscillator 10, it consists of a Schmitt trigger 36 which receives an input voltage $V_{SI}$ on a line 38 and provides an output voltage $V_{SO}$ on a line 40 to an inverting gate 42 which inverts voltage $V_{SO}$ and provides the inverted voltage on line 12. A resistor R0 is connected between lines 38 and 40, and a capacitor C0 is connected between line 38 and supply $V_{SS}$. Resistor R0 is about 100 kiloohms, and capacitor C0 is about 0.5 picofarads.

Oscillator 10 operates in a conventional manner. Schmitt trigger 36 has a low trigger level of about 1.5 volts and a high trigger level of about 3.0 volts. Output voltage $V_{SO}$ varies between a logical high or "1" value substantially equal to $V_{DD}$ and a logical low or "0" value about 0.2 volt above $V_{SS}$. When input voltage $V_{SI}$ is raised up to the high trigger level, trigger 36 triggers to cause output voltage $V_{SO}$ to drop from logical "1" to logical "0". Likewise, when voltage $V_{SI}$ is dropped down to the low trigger level, trigger 36 also triggers to cause voltage $V_{SO}$ to rise from logical "0" to logical "1". Accordingly, capacitor C0 alternately charges as current flows into it from resistor R0 to cause voltage $V_{SI}$ to rise up to the high trigger level which forces voltage $V_{SO}$ down to logical "0" and discharges as current flows from it through resistor R0 to pull voltage $V_{SI}$ down to the low trigger level which forces voltage $V_{SO}$ up to logical "1". This occurs at switching frequency f determined principally by the RC time constant of resistor R0 and capacitor C0. Preferably, frequency f is on the order of 8 megahertz. Since inverter 42 merely inverts voltage $V_{SO}$, oscillator 10 provides a signal that switches between logical "0" and logical "1" at frequency f.

Turning to charge pump 18, it is a two-stage system. A driver 44 receives signal $V_N$ on line 16 and provides a pair of complementary voltage signals $V_{P1}$ and $V_{P2}$. Voltage $V_{P1}$ which is substantially in phase with voltage $V_N$ drives one stage of pump 18 on a line 46 to one plate of a capacitor C1 whose other plate is connected through a node N1 to the anode of a diode D1. The anode of diode D1 is further connected to the cathode of a diode D0 whose anode provides bias voltage $V_{BB}$ on line 20. Voltage $V_{P2}$ drives the other stage of pump 18 on a line 48 to one plate of a capacitor C2 whose other plate is connected through a node N2 to the anode of a diode D2 whose cathode is connected to supply $V_{SS}$. The anode of diode D2 is also connected to the cathode of diode D1. Each of capacitors C1 and C2 is approximately 10 picofarads.

When pump 18 is in active operation, voltages $V_{P1}$ and $V_{P2}$ switch between a selected high value and a selected low value at frequency f of oscillator 10, voltage $V_{P1}$ being at the high value when voltage $V_{P2}$ is at the low value and vice versa. When pump 18 is inactive, voltage $V_{P1}$ is at the low value, while voltage $V_{P2}$ is at the high value. Preferably, these extreme values are $V_{SS}$ and $V_{DD}$.

As an aid in understanding the operation of charge pump 18, FIG. 2 illustrates an example of the variation with time t of various voltages including $V_{P1}$, $V_{P2}$, and $V_{BB}$. Supply $V_{SS}$ is taken as ground potential while voltage $V_{DD}$ is 5.0 volts. The left-hand portion of FIG. 2 up to breakpoints 50 represents the operation of pump 18 shortly after initial activation of the substrate bias generator. Bias voltage $V_{BB}$ is just slightly below ground during this period. The portion of FIG. 2 from breakpoints 50 to the right represents the operation when voltage $V_{BB}$ has been pumped down to a desired "steady-state" value $V_{BBM}$ which is approximately $-5$ volts. In the example shown in FIG. 2, desired value $V_{BBM}$ is close to the maximum pumping capability $V_{BBL}$ of pump 18.

Each diode D0, D1, or D2 becomes conductive when the forward voltage across it reaches a forward (diode-drop) threshold level of $V_{THE0}$, $V_{THE1}$, or $V_{THE2}$, respectively. This threshold level is nominally 0.7–0.8 volt.

Considering first the operation shortly after startup as illustrated by the lefthand portion of FIG. 2, the voltage $V_{N2}$ at node N2 is several tenths of a volt below ground just before the point at which voltage $V_{P2}$ begins to rise. As voltage $V_{P2}$ rises to $V_{DD}$, voltage $V_{N2}$ attempts to follow. However, when it reaches $V_{THE2}$ above ground, diode D2 becomes conductive. Voltage $V_{N2}$ temporarily rises higher as (positive) charge flows from node N2 to ground and then to $V_{THE2}$ above ground. Area 52 (illustrated in slanted lines) of the temporary rise of voltage $V_{N2}$ is indicative of the amount of charge pumped from node N2 to ground. Capacitor C2 is now charged to a high level of approximately $V_{DD}-V_{THE2}$.

While voltage $V_{P2}$ is at $V_{DD}$, voltage $V_{P1}$ is at ground, and the voltage $V_{N1}$ at node N1 is negative. Just before the point at which voltage $V_{P1}$ begins to rise, capacitor C1 is charged to a moderately small level. Voltage $V_{N1}$ attempts to follow voltage $V_{P1}$ as it rises to $V_{DD}$. Simultaneously, voltage $V_{P2}$ drops to ground, and voltage $V_{N2}$ attempts to follow voltage $V_{P2}$ down. An intermediate point is rapidly reached at which the forward voltage across diode D1 reaches $V_{THE1}$ to make it conductive. This point is determined by charge sharing between capacitors C1 and C2 and parasitic capacitances. Voltage $V_{N1}$ temporarily rises above the level at which diode D1 becomes conductive as (positive) charge flows from node N1 to node N2 and then drops down to a level just sufficient to leave diode D1 conductive. Area 54 (shown in slanted lines) of the temporary rise of voltage $V_{N1}$ is indicative of the positive charge transferred from node N1 to node N2. In a similar manner, voltage $V_{N2}$ temporarily goes below the level needed to make diode D1 conductive and then rises up to this level so that voltage $V_{N2}$ is $V_{THE1}$ below voltage $V_{N1}$. Area 56 (shown in slanted lines) of the temporary drop of voltage $V_{N2}$ is indicative of the negative charge that flows from node N2 to node N1.

As voltage $V_{P1}$ drops back down to ground, voltage $V_{N1}$ attempts to follow. However, when it drops $V_{THE0}$ below bias voltage $V_{BB}$, diode D0 becomes conductive. Voltage $V_{N1}$ temporarily drops below the level at which diode D0 becomes conductive as (positive) charge flows from the substrate to node N1 and then rises to a level just sufficient to leave diode D0 conductive. Area 58 (illustrated in slanted lines) of the temporary drop of voltage $V_{N1}$ is indicative of the charge that flows from the substrate to node N1. $\Delta V_{BB}$ represents the decrement in bias voltage $V_{BB}$ due to the charge pumped from the substrate to node N1.

In short, charge is pumped from node N2 to ground and then from node N1 to N2 after which charge is pumped from the substrate to node N1. During approximately the time period that diode D0 is conductive, diode D2 again becomes conductive to pump more charge from node N2 to ground. This is the beginning of the next pumping cycle.

During the time when charge is not actually being pumped from the substrate to node N1, bias voltage $V_{BB'}$ rises slightly due to leakage. The magnitude of voltage decrement $\Delta V_{BB}$ exceeds the amount that voltage $V_{BB}$ rises between each pair of pump down points. Accordingly, voltage $V_{BB}$ thereby moves progressively downward.

Pumpdown continues in this manner, normally for several hundred pumping cycles, unitl voltage $V_{BB}$ reaches "steady-state" value $V_{BBM}$. During this period, decrement $\Delta V_{BB}$ progressively decreases in magnitude.

When voltage $V_{BB}$ finally drops below $V_{BBM}$, pump 18 turns off for one or more pumping cycles as shown in the right-hand portion of FIG. 2 until voltage $V_{BB}$ has risen above $V_{BBM}$ to reinitiate pumping action. Areas 60, 62, and 64 (shown in slanted lines) are indicative of the charge transfers in one pumping cycle corresponding to areas 54, 56, and 58, respectively. The charge transferred from the substrate to node N1 is just sufficient to bring voltage $V_{BB}$ slightly below $V_{BBM}$. Area 66 (shown in slanted lines) represents the charge transferred from node N2 to ground at the beginning of the next pumping cycle. This pumping cycle is terminated at time 68, and pumping operation is discontinued until time 70. Areas 72, 74, and 76 (shown in slanted lines) are indicative of the charge transfers when pumping operation restarts corresponding to areas 60, 62, and 64 respectively.

Maximum pumping capability $V_{BBL}$ is determined as follows. When diode D2 is conductive after charge has been pumped from node N2 to ground, voltage $V_{N2}$ is $V_{THE2}$ above ground. After voltage $V_{P2}$ drops to ground, voltage $V_{N2}$ drops by a fraction $\alpha_2$ of $V_{DD}$ down to the level at which diode D1 just becomes conductive. After charge transfer between nodes N1 and N2, voltage $V_{N1}$ is $V_{THE1}$ above voltage $V_{N2}$. Similarly, as voltage $V_{P1}$ drops down to ground, voltage $V_{N1}$ decreases from its previous level by a fraction $\alpha_1$ of $V_{DD}$ to the point at which diode D0 becomes conductive. Immediately after charge transfer from the substrate to node N1, voltage $V_{BB}$ is $V_{THE0}$ above voltage $V_{N1}$. Accordingly, value $V_{BBL}$ is given by $$V_{BBL} \approx V_{THE0} + V_{THE1} + V_{THE2} - (\alpha_1 + \alpha_2)V_{DD} \quad (1)$$

$\alpha_1$ and $\alpha_2$ are each approximately 0.7 to 0.8 and are principally a function of the capacitances of capacitors C1 and C2, respectively, and the parasitic capacitances at nodes N1 and N2, respectively.

If less pumping capability is acceptable, charge pump 18 could be a single-stage device by connecting diode D1 to ground and eliminating diode D2 and capacitor C2. Conversely, the pumping capability could be increased by adding more stages connected like second stage C2 and D2 with the last diode being connected to ground. Each additional odd-numbered stage is driven by a voltage equal to signal $V_{P1}$ whereas each additional even-numbered stage is driven by a voltage which is the same as voltage $V_{P2}$.

Returning to FIG. 1, oscillator 10, NOR gate 14, and charge pump 18 interacts as follows: When a logical "0" is supplied on line 32 to NOR gate 14, it inverts the signal on line 12 and thereby transmits voltage $V_{SO}$ at switching frequency f directly to driver 44. Pump 18 is activated as voltages $V_{P1}$ and $V_{P2}$ switch between $V_{SS}$ and $V_{DD}$ at frequency f. When a logical "1" is supplied on line 32 to NOR gate 14, signal $V_N$ *on line* 16 *is a logical* "0". Voltages $V_{P1}$ and $V_{P2}$ no longer switch as pump 18 is deactivated.

In the feedback circuitry, voltage divider 22 consists of a resistor RH connected between lines 20 and 24 and a resistor RL connected between line 24 and supply $V_{SS}$. Signal $V_{INT}$ on line 24 therefore equals $V_{BB}/\beta$ where $\beta$ equals one plus the ratio of the resistance of resistor RH to that of resistor RL.

Inasmuch as the current-sinking capability of FET's QE and QD is far greater than that of FET QR, FET QE operates at the lower edge of the conductive range. The voltage on line 26 at the drain of FET QE equals its gate electrode voltage which necessarily at least equals the threshold voltage $V_{TE}$ of FET QE where supply $V_{SS}$ is taken as ground. If the drain voltage for FET QE were to rise above $V_{TE}$, FET QE would become more conductive, and the drain voltage would drop down to $V_{TE}$. Likewise, if the drain voltage were to drop below $V_{TE}$, FET QE would start to turn off. This would cause the drain voltage to return to $V_{TE}$. Accordingly, the voltage on line 26 remains continuously at $V_{TE}$. When voltage $V_{INT}$ is at least the threshold voltage $V_{TD}$ of FET QD above its source voltage on line 26, FET QD turns on. The switching point for FET QD thereby occurs when voltage $V_{INT}$ equals $V_{TE}+V_{TD}$. The sum $V_{TE}+V_{TD}$ is effectively a reference voltage. By combining the two foregoing relationships for voltage $V_{INT}$, "steady-state" value $V_{BBM}$ is given by:

$$V_{BBM}=\beta V_{REF}=\beta(V_{TE}+V_{TD}) \qquad (2)$$

When voltage $V_{BB}$ is above $V_{BBM}$, FET QD is conductive. It draws current from source $V_{DD}$ through resistively-connected FET QR across which a large voltage drop occurs to bring feedback signal $V_{FB}$ on line 28 down to a low value. Buffer 30 appropriately converts this low value into a logical "0" which is supplied on line 32 to NOR gate 14 so as to activate charge pump 18. When voltage $V_{BB}$ drops below $V_{BBM}$, FET QD turns off. Voltage $V_{FB}$ rises substantially up to a high value near $V_{DD}$ since current no longer flows through FET QD. Buffer 30 then converts this high value into a logical "1" which is supplied on line 32 to NOR gate 14 to disable charge pump 18 in the manner described above.

When threshold voltages $V_{TD}$ and $V_{TE}$ are known, voltage $V_{BBM}$ is determined from Eq.(2). This calculation is, however, complicated by the fact that voltages $V_{TE}$ and $V_{TD}$ themselves vary with bias voltage $V_{BB}$. This occurs because the width of the depletion area between the substrate and the gate electrode of an FET increases as voltage $V_{BB}$ decreases. For a typical FET, its threshold voltage $V_T$ is given by:

$$V_T = V_{T0} + K\sqrt{V_S - V_{BB} + 2\phi_F} \qquad (3)$$

where $V_{T0}$ is the threshold voltage for the FET at a given value of voltage $V_{BB}$, K is a constant, $V_S$ is the voltage between groung and the source of the FET, and $\phi_F$ is the Fermi voltage which approximately equals 0.3 volt.

Approximately combining Eqs. (2) and (3) and noting that the source of FET QE is at ground potential gives:

$$V_{BBM} = \beta(V_{TE0} + K_E\sqrt{-V_{BBM} + 2\phi_F} + V_{TD0} + K_D\sqrt{V_{SD} - V_{BBM} + 2\phi_F}) \qquad (4)$$

where the subscripts "E" and "D" refer to FET's QE and QD, respectively. $K_E$ has a maximum value of about 0.2 $\sqrt{\text{volt}}$, while $K_D$ has a maximum value of about 0.7 $\sqrt{\text{volt}}$. The terms involving the square roots are typically around half as large as the other terms on the right-hand side of Eq.(4).

Figure 3:
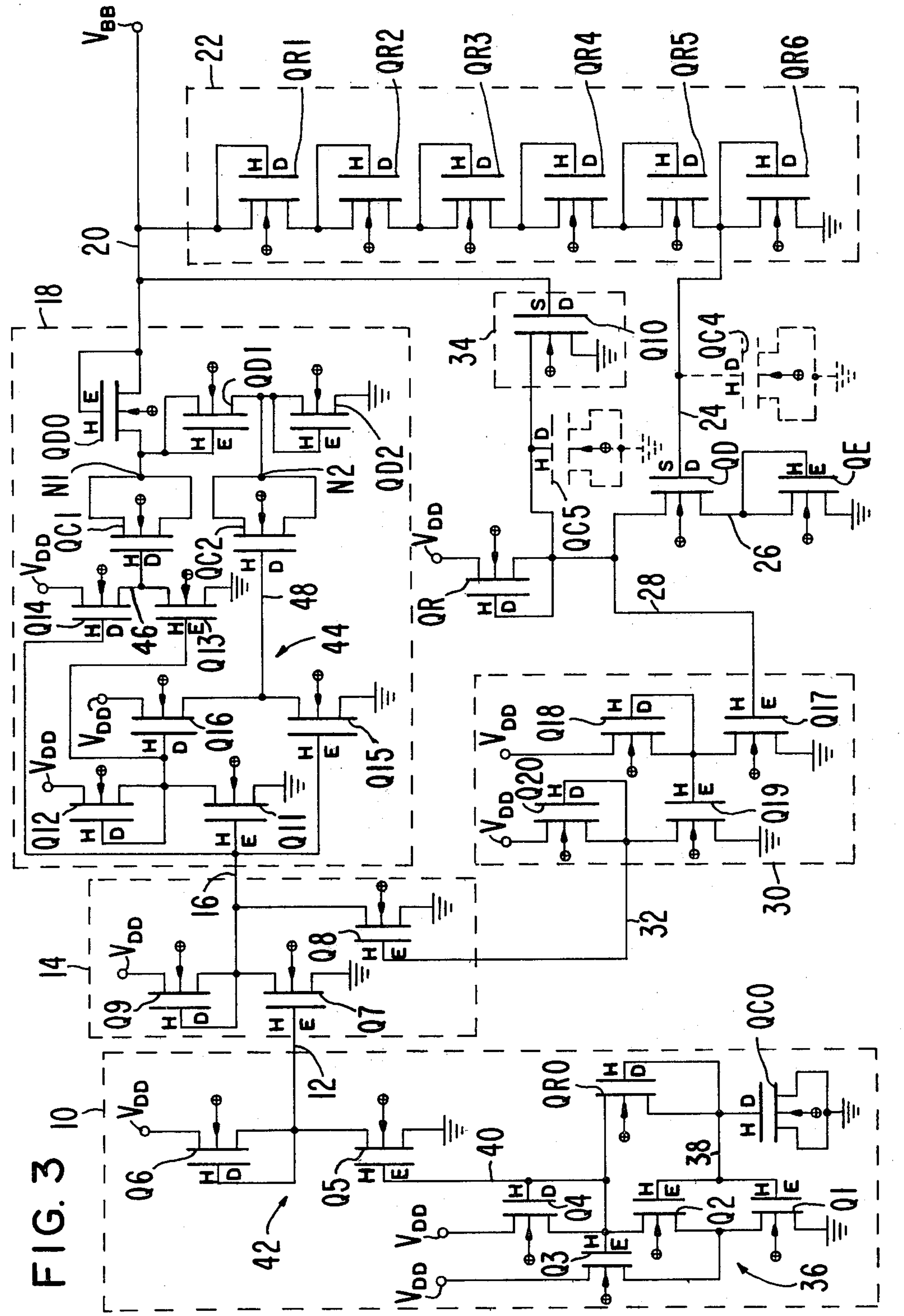
FIG. 3 is a circuit diagram of a particular embodiment of the bias generator of FIG. 1.

FIG. 3 illustrates a preferred embodiment of the substrate bias generator of FIG. 1 in which all the elements are formed from N-channel FET's. The substrate terminal for each FET is an "⊕" which represents the connection to line 20 to receive bias voltage $V_{BB}$. Some of the FET's in FIG. 3 are "hard" FET's whereas others are "soft" FET's. The distinction between "hard" and "soft" relates solely to threshold voltage. A "hard" N-channel depletion-mode FET has a threshold voltage in a selected range which is more negative than the threshold voltage range for "soft" N-channel depletion-mode FET's. Similarly, a "hard" N-channel enhancement-mode FET has a threshold voltage in a range which is more positive than the threshold voltage range for "soft" N-channel enhancement-mode FET's. This is illustrated by FIG. 4 which is discussed further below. To distinguish the various types of FET's in FIG. 3, "S" or "H" is placed next to each FET to indicate that it is either a "soft" FET or a "hard" FET, respectively. Likewise, "E" or "D" is placed next to each FET to indicate that it is either an enhancement device or a depletion device, respectively.

Starting with oscillator 10, Schmitt trigger 36 consists of switching FET's Q1, Q2, and Q3 and a resistive depletion load FET Q4. Capacitor C0 is a capacitively-connected FET QC0. Resistor R0 is a resistively-connected depletion-mode FET QR0. Inverter 42 consists of a switching FET Q5 and a resistive depletion load FET Q6.

NOR gate 14 consists of enhancement switching FET's Q7 and Q8 whose gate electrodes serve as input terminals and a resistive depletion load FET Q9.

In charge pump 18, driver 44 consists of a first inverter formed by a switching FET Q11 and a resistive depletion load FET Q12, a second inverter formed by a switching FET Q13 and a resistive depletion load FET Q14, and a third inverter formed by a switching FET Q15 and a resistive depletion load FET Q16. The first inverter inverts voltage $V_N$ while the second and third inverters are high-current buffers for supplying voltages $V_{P1}$ and $V_{P2}$, respectively, in response to the output of the first inverter and voltage $V_N$, respectively. Capacitors C1 and C2 are capacitively-connected FET's QC1 and QC2, respectively. Diodes D0, D1, and D2 are diode-connected FET's QD0, QD1, and QD2, respectively. With respect to FIG. 2, $V_{THE0}$, $V_{THE1}$, and $V_{THE2}$ are the threshold voltages for FET's QD0, QD1, and QD2.

Returning to FIG. 3, resistor RH in voltage divider 22 consists of five identical mode FET's QR1, QR2, QR3, QR4, and QR5 connected in series. Resistor RL is a sixth depletion-mode FET QR6. Each of FET's QR1-QR6 has its gate electrode connected to its source to serve as a resistive element.

More generally, divider 22 consists of N identical resistively-connected FET's, and voltage $V_{INT}$ is taken between ground and the last FET-e.g., FET QR6. $\beta$ equals N to a first-order approximation. More precisely, the resistance of the last FET is slightly greater than that of any of the other FET's in divider 22. This occurs because the source-to-ground voltage of the last FET is higher than that of the other FET's so that, upon reference to Eq. (3), the last FET has a slightly higher threshold voltage and is therefore slightly less conductive. Consequently, $\beta$ is slightly lower than N—e.g., slightly lower than 6 for divider 22 of FIG. 3.

Alternatively, resistors RH and RL in divider 22 could be conventional resistors made of low-doped polycrystalline semiconductor material such as polycrystalline silicon.

In the reference/comparator circuitry of the feedback loop in FIG. 3, FET QE is a hard enhancement-mode device while FET QD is a soft depletion-mode device. More particularly, the absolute value of threshold voltage $V_{TD}$ exceeds that of threshold voltage $V_{TE}$. The reference sum $V_{TE}+V_{TD}$ is negative and varies with the FET processing corner in the manner described below. FET QR is a hard depletion-mode device.

Buffer 30 consists of a first inverter formed by a switching FET Q17 and a resistively-connected depletion load FET Q18 and a second inverter formed by a switching FET Q19 and a resistively connected depletion load FET Q20. The first inverter in buffer 30 amplifies and inverts signal $V_{FB}$ while the second inverter reinverts the output from the first inverter to provide an amplified digital feedback signal of the same polarity on line 32 as that of voltage $V_{FB}$.

Clamp 34 consists of a depletion-mode FET Q10 whole source is grounded and whose gate electrode is responsive to voltage $V_{BB}$ on line 20. The drain of FET Q10 is connected to feedback line 28. FET Q10 preferably has a gate width-to-length ratio of $\frac{1}{3}$ and thus has a considerably greater current-sinking capability than that of FET QR. Whenever voltage $V_{BB}$ is about 0.5 volt above the threshold voltage of FET Q10, it becomes sufficiently conductive to draw enough current through impedance element QR to reduce voltage $V_{FB}$ down to its low value. A logical "0" is supplied on line 32 to NOR gate 14 to activate pump 18 and pull voltage $V_{BB}$ down.

The bias generator shown in FIG. 3 also optionally includes a pair of capacitively-connected FET's QC4 and QC5 connected between ground and lines 24 and 28, respectively. FET's QC4 and QC5 reduce perturbations in signals $V_{INT}$ and $V_{FB}$, respectively.

In manufacturing a semiconductor device on a silicon substrate containing the present bias generator, the threshold voltages of the various FET's are preferably established by selective ion implantation of a pair of semiconductor dopants of opposite conductivity types. FIG. 4 facilitates the understanding of this process for N-channel FET's. The threshold voltage ranges shown in FIG. 4 are all taken for an FET having a gate width of 16 microns and a gate length of 4 microns at a value of $-2.5$ volts for voltage $V_{BB}$ and at a chip temperature of 25° C.

In the substrate areas for soft enhancement-mode FET's, appropriate masks are used to prevent either of the dopants from entering the channel regions. Nevertheless, the threshold voltages for soft enhancement FET's still vary from chip-to-chip because of other factors. The soft enhancement range extends from 0.0 volt to 0.4 volt. Soft enhancement FET's are in the Fast condition (FF and FS corners) on chips at the low end of this range and are in the Slow condition (SF and SS corners) on chips at the high end.

The threshold voltages for hard enhancement-mode FET's are established by implanting a P-type impurity such as boron in the channel areas for the hard enhancement FET's while masking these areas from implantation by the other dopant. The P-type impurity is implanted at a nominal dosage of $2.3\times10^{11}$ ions per centimeter$^2$ at a nominal energy of 45 kiloelectron volts through a silicon-dioxide gate dielectric whose final thickness is about 700 angstroms. The resulting variation from chip to chip in the amount of the P-type impurity implanted in combination with the variation in threshold voltage doping level for soft enhancement FET's defines the threshold voltage range for hard enhancement FET's which is 0.6 volt to 1.1 volts here. Hard enhancement FET's at the low end are in the Fast condition (FF and FS corners) while those at the high end are in the Slow condition (SF and SS corners).

In a similar manner, the threshold voltages for hard depletion-mode FET's are established by implanting an N-type impurity such as arsenic in the channel regions for the hard depletion FET's but masking these regions from implantation by the P-type impurity. The N-type impurity is implanted at a nominal dosage of $1.1\times10^{12}$ ions per centimeter$^2$ at a nominal energy of 100 kiloelectron volts through a silicon-dioxide gate dielectric whose final thickness is again about 700 angstroms. The resulting chip-to-chip variation in threshold voltage for hard depletion FET's extends from a low value of $-3.1$ volts to a high value of $-2.5$ volts. Hard depletion FET's at the low end are in the Fast condition (FF and SF corners), while those at the high end are in the Slow condition (FS and SS corners).

The threshold voltages of soft depletion-mode FET's are established by leaving their channel areas open to implantation by both impurities at the foregoing dosages and energies. The implantations are again performed through a silicon-dioxide gate dielectric of the same thickness as before. While the soft enhancement, hard enhancement, and hard depletion FET's are independent of each other insofar as the two threshold voltage implantations are concerned, the soft depletion FET's are therefore dependent on the hard enhancement and hard depletion FET's with respect to these implantations. This means that the threshold voltages of the soft depletion FET's extend over a composite range consisting of a pair of ranges. One of these ranges extends from −1.9 volts at the FF corner of the processing range up to −1.5 volts at the FS corner of the processing range. The other range extends from −1.5 volts at the SF corner of the processing range to −1.1 volts at the SS corner of the processing range. In short, the threshold voltages for soft depletion FET's in the FF corner differ not only from those in the SS corner, but also from those in FS and SF corners.

Bias voltage $V_{BB}$ is precisely regulated as a function of the corner of the FET processing range by using the operational feature described by Eq.(2) in combination with the chip-to-chip variations in threshold voltages $V_{TD}$ and $V_{TE}$ of soft depletion FET QD and hard enhancement FET QE, as for example, illustrated in FIG. 4. The sum of $V_{TD}$ and $V_{TE}$ is (1) a negative maximum (i.e., lowest) in the FF corner (2) intermediate in the FS and SF corners, and (3) a negative minimum (i.e., highest) in the SS corner. In view of Eq.(2), voltage $V_{BB}$ is therefore (1) a negative maximum in the FF corner (2) intermediate in the FS and SF corners, and (3) a negative minimum in the SS corner. This provides identically the desired variation in voltage $V_{BB}$ to speed up the slowest FET's and logic gates and to slow down the fastest FET's and logic gates so as to reduce the chip to chip spread between the slowest and fastest gates compared to the spread which exists when voltage $V_{BB}$ is maintained at substantially a constant value from chip-to-chip. Likewise, the present voltage bias generator reduces the highest power dissipation and increases the lowest power dissipation so as to decrease the best-case/worst-case spread. The same holds true for the noise margin.

The performance improvement obtainable with the present bias generator is shown by the simulated performance results given in Tables I and II below at two values of supply voltage $V_{DD}$. The upper portion of the results in each table indicates the performance when the present bias generator is not used, while the lower portion of the results gives the improved performance obtained with the present bias generator. T is the chip temperature, $V_{NM}$ is the noise margin, $t_D$ is the gate propagation delay, and $P_D$ is the average power dissipation. Reference threshold voltages $V_{TE0}$ and $V_{TD0}$ from FIG. 4 are used in achieving the results of Tables I and II. The improvement in best-case/worst-case spread in propagation delay and power dissipation is at least 25%. The worst-case noise margin is improved by a little less than 0.1 volt.

TABLE I

| T = 125° C. $V_{DD}$ = 5.25 volts | PROCESSING RANGE FF | FS | SF | SS | SPREAD MAX./MIN. |
|---|---|---|---|---|---|
| $V_{BB}$ (volt) | −2.5 | −2.5 | −2.5 | −2.5 | |
| $t_D$ (nsec) | 3.9 | 8.5 | 6.6 | 15.6 | 4.0 |
| $P_D$ (mw) | 0.34 | 0.17 | 0.26 | 0.12 | 2.8 |
| $V_{BBM}$ (volt) | −5.0 | −3.3 | −1.8 | −0.8 | |
| $t_D$ (nsec) | 4.3 | 9.1 | 6.4 | 13.1 | 3.0 |
| $P_D$ (mw) | 0.28 | 0.15 | 0.28 | 0.16 | 1.8 |

TABLE II

| T = 125° C. $V_{DD}$ = 4.55 volts | PROCESSING RANGE FF | FS | SF | SS |
|---|---|---|---|---|
| $V_{BB}$ (volt) | −2.5 | −2.5 | −2.5 | −2.5 |

TABLE II-continued

| T = 125° C. $V_{DD}$ = 4.55 volts | PROCESSING RANGE FF | FS | SF | SS |
|---|---|---|---|---|
| $V_{NM}$ (volt) | 0.30 | 0.48 | 0.81 | 0.90 |
| $V_{BB}$ (volt) | −5.0 | −3.3 | −1.8 | −0.8 |
| $V_{NM}$ (volt) | 0.36 | 0.50 | 0.75 | 0.78 |

All of the FET's and other circuit elements are manufactured according to conventional MOS processing techniques. PN junction isolation is employed to separate active semiconductor regions from one another. The threshold voltages for the various FET's are preferably established by implanting N-type and P-type impurities at the levels described above.

While the invention has been described with reference to particular embodiments, this description is solely for the purpose of illustration and is not to be construed as limiting the scope of the invention claimed below. For example, P-channel FET's may be used in place of the N-channel FET's described, and corresponding changes are then made in the ion implantations to establish a corresponding variation in the threshold voltages of the P-channel FET's. Furthermore, a pair of complementary FET's—i.e. an N-channel device and a P-channel device—might be used as the FET's whose threshold voltages define the reference voltage that establishes the switching point in the feedback loop. Thus, various modifications, changes, and applications may be made by those skilled in the art without departing from the true scope and spirit of the invention as defined by the appended claims.

What is claimed is:

1. A circuit for generating a bias voltage for a semiconductor substrate wherein the circuit has oscillating means for repetitively supplying an oscillating signal at a given frequency, gating means responsive to the oscillating signal and to a feedback signal for supplying a gating signal which varies at the given frequency only when the feedback signal achieves a specified first relationship, pumping means responsive to the gating signal for supplying the bias voltage on an output line and for causing the bias voltage to move unidirectionally toward a desired value only when the gating signal achieves a specified second relationship, and feedback means responsive to the bias voltage for providing the feedback signal, characterized in that the feedback means comprises a field-effect transistor (FET) having a positive threshold voltage and an FET having a negative threshold voltage so arranged that the feedback signal achieves the first relationship when the absolute value of a reference voltage comprising the sum of the threshold voltages is at least equal to the absolute value of an internal voltage bearing a specified third relationship to the bias voltage.

2. A circuit as in claim 1 characterized in that a first of the FET's has a first source/drain element coupled to a supply of a substantially constant voltage and a gate electrode and a second source/drain element connected to each other, that the second of the FET's has a first source/drain element coupled to the gate electrode of the first FET, a gate electrode for receiving the internal voltage on an internal line, and a second source/drain element for supplying the feedback signal on a feedback line, and that the absolute value of the threshold voltage of the second FET exceeds the absolute value of the threshold voltage of the first FET.

3. A circuit as in claim 2 characterized in that the first FET is an enhancement-mode FET of a given polarity and that the second FET is a depletion-mode FET of the given polarity.

4. A circuit as in claim 3 characterized in that the absolute value of the reference voltage is (1) a maximum in the Fast Fast corner of the FET processing range and (2) a minimum in the Slow Slow corner of the FET processing range.

5. A circuit as in claim 4 characterized in that the absolute value of the difference between the constant voltage and the bias voltage when it reaches a substantially steady-state value is (1) a maximum in the Fast Fast corner of the FET processing range and (2) a minimum in the Slow Slow corner of the FET processing range.

6. A circuit as in claim 3 characterized in that introduction of a first semiconductor dopant at a nominal first dosage into the channel of the enhancement-mode FET sets its threshold voltage at a level different from its otherwise original level, that introduction of both the first dopant at the nominal first dosage and a second semiconductor dopant at a nominal second dosage into the channel of the depletion-mode FET sets its threshold voltage, and that the dopants are of opposite conductivity types with the second dopant being of the same conductivity type as any of the source/drain elements.

7. A circuit as in claim 6 characterized in that each introduction is an ion implantation.

8. A circuit as in claim 7 characterized in that absolute value of the threshold voltage of the enhancement-mode FET varies over its processing range from a minimum at the Fast Fast and Fast Slow corners to a maximum at the Slow Fast and Slow Slow corners and that the absolute value of the threshold voltage of the depletion-mode FET varies over its processing range from a minimum at the Slow Slow corner to a maximum at the Fast Fast corner and is intermediate at the Fast Slow and Slow Fast corners.

9. A circuit as in claim 8 characterized in that the absolute value of the difference between the constant voltage and the bias voltage when it reaches a substantially steady-state value varies from a minimum at the Slow Slow corner to a maximum at the Fast Fast corner and is intermediate at the Fast Slow and Slow Fast corners.

10. A circuit as in claim 4 characterized by an impedance element coupled between a voltage/current supply and the second source/drain element of the depletion-mode FET.

11. A circuit as in claim 4 characterized in that a resistive voltage divider divides the bias voltage to generate the internal voltage as a given fraction of the bias voltage.

12. A circuit as in claim 11 characterized in that the voltage divider comprises a pair of divider sections, each comprising at least one resistively-connected FET.

13. A circuit as in claim 11 characterized in that the voltage divider comprises a pair of resistors of polycrystalline semiconductor material.

14. A circuit as in claim 11 characterized by clamping means for preventing the bias voltage from entering a restricted voltage range.

15. A circuit as in claim 12 characterized in that the clamping means is coupled between the output and feedback lines.

16. A circuit as in claim 15 characterized in that the clamping means comprises a depletion-mode FET of the given polarity having a first source/drain element coupled to the supply of the substantially constant voltage, a gate electrode coupled to the output line, and a second source/drain element coupled to the feedback line.

17. A circuit as in claim 1, 2, 3, 4, 5, 6, 7, 8, 9, 10, 11, 12, 13, 14, 15, or 16 characterized in that each FET is an N-channel FET.

* * * * *